United States Patent
Chen et al.

(10) Patent No.: US 9,362,372 B2
(45) Date of Patent: Jun. 7, 2016

(54) SEMICONDUCTOR DEVICE WITH A STEP GATE DIELECTRIC STRUCTURE

(71) Applicant: Vanguard International Semiconductor Corporation, Hsinchu (TW)

(72) Inventors: Sue-Yi Chen, Hsinchu (TW);
Chien-Hsien Song, Kaohsiung (TW);
Chih-Jen Huang, Dongshan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/656,365

(22) Filed: Mar. 12, 2015

(65) Prior Publication Data

US 2015/0200261 A1     Jul. 16, 2015

Related U.S. Application Data

(62) Division of application No. 13/967,988, filed on Aug. 15, 2013, now Pat. No. 9,012,988.

(51) Int. Cl.
| | |
|---|---|
| *H01L 21/762* | (2006.01) |
| *H01L 29/40* | (2006.01) |
| *H01L 29/78* | (2006.01) |
| *H01L 29/66* | (2006.01) |
| *H01L 29/423* | (2006.01) |
| *H01L 29/51* | (2006.01) |

(52) U.S. Cl.
CPC ........ *H01L 29/402* (2013.01); *H01L 21/76224* (2013.01); *H01L 29/42368* (2013.01); *H01L 29/513* (2013.01); *H01L 29/517* (2013.01); *H01L 29/518* (2013.01); *H01L 29/66659* (2013.01); *H01L 29/66681* (2013.01); *H01L 29/7816* (2013.01); *H01L 29/7835* (2013.01)

(58) Field of Classification Search
CPC .............................................. H01L 21/823456
USPC ................................................... 438/140, 454
See application file for complete search history.

(56) References Cited

U.S. PATENT DOCUMENTS

| | | | | |
|---|---|---|---|---|
| 6,107,160 | A * | 8/2000 | Hebert | H01L 23/552 |
| | | | | 438/454 |
| 7,977,715 | B2 * | 7/2011 | Cai | H01L 21/823412 |
| | | | | 257/288 |
| 8,836,026 | B2 * | 9/2014 | Roehrer | H01L 29/0653 |
| | | | | 438/286 |

* cited by examiner

*Primary Examiner* — Chandra Chaudhari
(74) *Attorney, Agent, or Firm* — Birch, Stewart, Kolasch & Birch, LLP (57) ABSTRACT

A semiconductor device and a method for forming the same are disclosed. The semiconductor device includes an isolation structure formed in a substrate to define an active region of the substrate. The active region has a field plate region therein. A step gate dielectric structure is formed on the substrate in the field plate region. The step gate dielectric structure includes a first layer of a first dielectric material and a second layer of the dielectric material, laminated vertically to each other. The first and second layers of the first dielectric material are separated from each other by a second dielectric material layer. An etch rate of the second dielectric material layer to an etchant is different from that of the second layer of the first dielectric material. A method for forming a semiconductor device is also disclosed.

10 Claims, 5 Drawing Sheets

SEMICONDUCTOR DEVICE WITH A STEP GATE DIELECTRIC STRUCTURE

CROSS REFERENCE TO RELATED APPLICATIONS

This application is a Divisional of copending application Ser. No. 13/967,988, filed on Aug. 15, 2013, all of which are hereby expressly incorporated by reference into the present application.

BACKGROUND OF THE INVENTION

1. Field of the Invention

The present invention relates to a semiconductor device and a method for forming the same, and in particular, to a semiconductor device having a shallow trench isolation (STI) structure and a method for forming the same.

2. Description of the Related Art

A power management integrated circuit (PMIC) is presently primarily applied to bipolar-CMOS (complementary metal oxide semiconductor transistor)-LDMOS (lateral diffused metal oxide semiconductor transistor) (BCD) structures. Complementary metal oxide semiconductor (CMOS) transistors may be used in digital circuits, bipolar transistors may be used for driving high current, and lateral diffused metal oxide semiconductor (LDMOS) transistors have high voltage (HV) handling capacity. The trends of power saving and high speed performance affect the structure of the LDMOS transistor. LDMOS transistor structures with lower leakage and on-resistance (RDSon) have been developed by semiconductor manufacturers.

The LDMOS devices are developed in various structures or by increasing the device size thereof to withstand a high off-state breakdown voltage. However, since the device size is increased, it is hard to reduce the on-resistance of the conventional LDMOS devices. RDSon is an important factor which affects the power consumption of the conventional LDMOS device. Therefore, the conventional LDMOS devices have a high on resistance to drain-source breakdown voltage ratio (Bvdss) (Ron/BVdss ratio), thereby affecting the reliability of the BCD processes.

Thus, a semiconductor device and a method for forming the same are desired to solve the aforementioned problems.

BRIEF SUMMARY OF INVENTION

A semiconductor device and a method for forming the same are provided. An exemplary embodiment of a semiconductor device comprises an isolation structure formed in a substrate to define an active region of the substrate. The active region has a field plate region therein. A step gate dielectric structure is formed on the substrate in the field plate region, wherein the step gate dielectric structure comprises a first layer of a first dielectric material and a second layer of the first dielectric material, laminated vertically to each other. The first and second layers of the first dielectric material are separated from each other by a second dielectric material layer. An etch rate of the second dielectric material layer to an etchant is different from that of the second layer of the first dielectric material to the etchant.

An exemplary embodiment of a method for forming a semiconductor device, comprises providing a substrate. A first layer of a first dielectric material and a second dielectric material layer are formed on a surface of the substrate in sequence. The first layer of the first dielectric material and the second dielectric material layer are patterned. A portion of the substrate is removed using the patterned first layer of the first dielectric material and the patterned second dielectric material layer as a hard mask to form an isolation trench. An isolation structure in the isolation trench is formed to define an active region of the substrate. A second layer of the first dielectric material is entirely formed. A mask pattern is formed on the second layer of the first dielectric material in the active region to define a field plate region in the active region. An etching process is performed to remove the second layer of the first dielectric material not covered by the mask pattern to form a second layer pattern of the first dielectric material, wherein the patterned second dielectric material layer serves as an etching stop layer for the etching process. The patterned first layer of the first dielectric material and the patterned second dielectric material layer not covered by the second layer pattern of the first dielectric material are removed to form a step gate dielectric structure on the substrate in the field plate region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Embodiments provide a semiconductor device. In this embodiment, the semiconductor device may be a P-type bipolar-CMOS (complementary metal oxide semiconductor transistor)-LDMOS (lateral diffused metal oxide semiconductor transistor) (BCD). Embodiments use a hard mask layer used for formation of isolation structures (such as shallow trench isolations (STIs)), an additional deposition process and an additional photolithography/etching process to form a step gate dielectric structure on a surface of a substrate, in a field plate region of the substrate. The step gate dielectric structure is used to replace the STI field plate structure used in the conventional high voltage device. Compared with the conventional high voltage device, one embodiment of a step gate dielectric structure used in a high voltage device may have a reduced current path from a source region to a drain region of the high voltage device, thereby reducing the on-resistance (RDSon) while maintaining high breakdown voltage of a semiconductor device. Further, power consumption of a LDMOS transistor device can be reduced.

Figure 1:
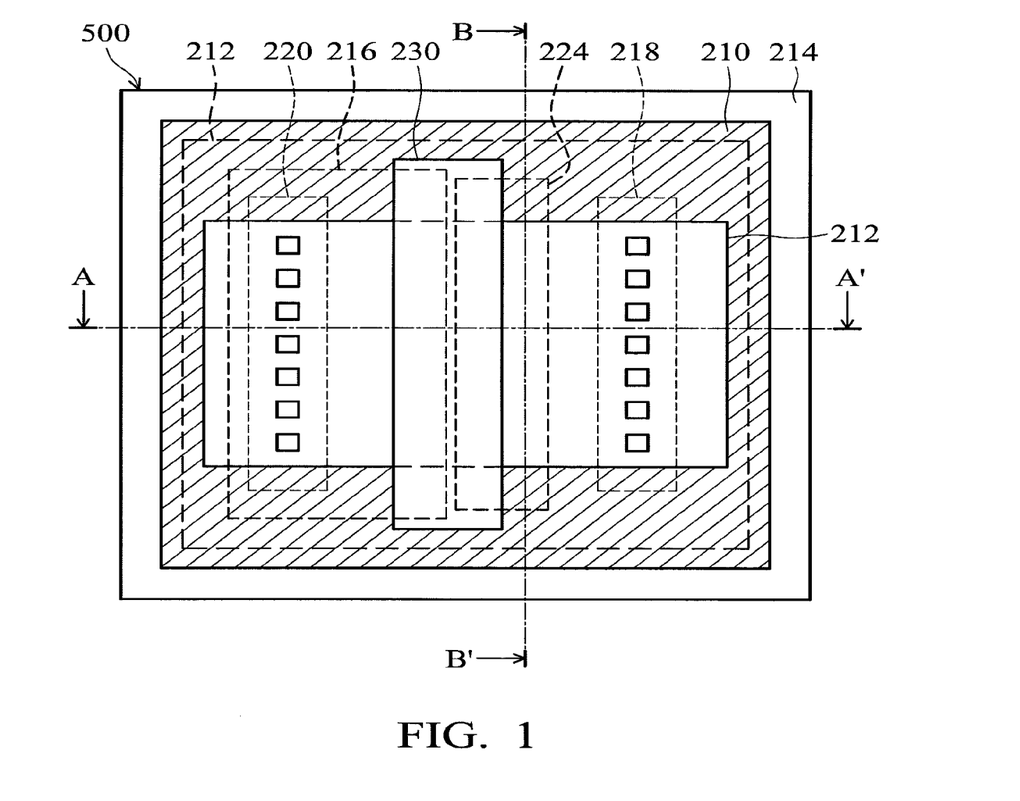
FIG. 1 is a top view of one embodiment of a semiconductor device of the invention.
Figure 2:
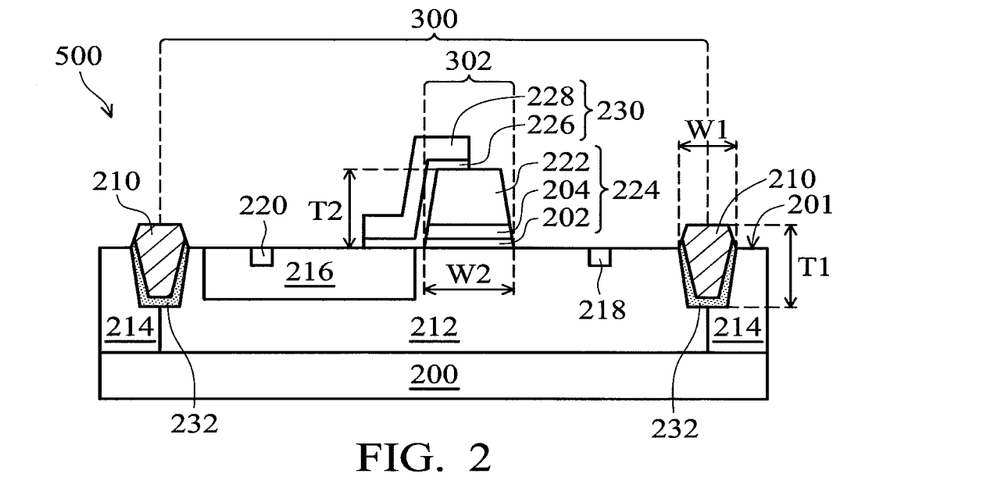
FIG. 2 is a cross section taken along a line A-A' of FIG. 1, showing a cross section along a channel length direction of one embodiment of a semiconductor device of the invention.
Figure 3:
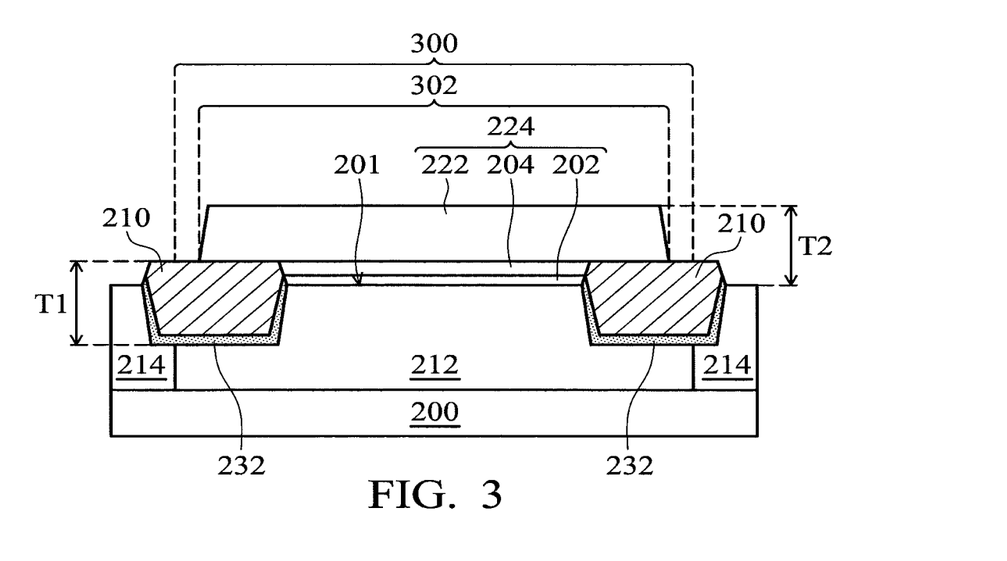
FIG. 3 is a cross section taken along a line B-B' of FIG. 1, showing a cross section along a channel width direction of one embodiment of a semiconductor device of the invention.

FIG. 1 is a top view of one embodiment of a semiconductor device 500 of the invention. FIG. 2 is a cross section taken along a line A-A' of FIG. 1, showing a cross section along a channel length direction of one embodiment of a semiconductor device 500 of the invention. FIG. 3 is a cross section taken along a line B-B' of FIG. 1, showing a cross section along a channel width direction of one embodiment of a semiconductor device 500 of the invention. In this embodiment, the semiconductor device 500 may be a P-type BCD. As shown in FIGS. 1-3, in one embodiment, the semiconductor device 500 may comprise a substrate 200, an isolation structure 210 and a step gate dielectric structure 224. The isolation structure 210 is disposed in the substrate 200 to define an active region 300 of the substrate 200, wherein the active region 300 has a field plate region 302 therein. Additionally, the step gate dielectric structure 224 is formed on the substrate 200 in the field plate region 302. In one embodiment, the step gate dielectric structure 224 may comprise a first layer of a first dielectric material 202 and a second layer of the first dielectric material 222 vertically laminated to each other. Also, the step gate dielectric structure 224 may comprise a second dielectric material layer 204. In one embodiment, the first and second layers of the first dielectric materials 202 and 222 are separated from each other by the second dielectric material layer 204.

As shown in FIGS. 1-3, in one embodiment, the semiconductor device 500 may further comprise a first doped region 216 disposed in the active region 300 between the field plate region 302 and the isolation structure 210, wherein a conductive type of the first doped region 216 is different from that of the substrate 200 in the active region 300. The semiconductor device 500 may further comprise a second doped region 212 disposed in the substrate 200 in the active region 300, wherein the second doped region 212 surrounds the first doped region 216, and a conductive type of the first doped region 216 is different from that of the second doped region 212. The semiconductor device 500 may further comprise a third doped region 216 disposed in the substrate 200 on the outside of the active region 300, surrounding the isolation structure 210, wherein the conductive type of the first doped region 216 is the same as that of the third doped region 214. The semiconductor device 500 may further comprise a gate structure 230 disposed on the substrate 200 in the active region 300, extended covering the first doped region 216 to the step gate dielectric structure 224.

In one embodiment, the first layer of the first dielectric material 202 and the second dielectric material layer 204, which are respectively formed by materials different from each other, may be collectively used as a hard mask for formation of isolation structures (such as shallow trench isolations (STIs)). Additionally, in one embodiment, both the first and second layers of the first dielectric materials 202 and 222 may be formed of materials which are the same as each other. Therefore, the second dielectric material layer 204 of the step gate dielectric structure 224 may be used as an etching stop layer of an etching process for formation of the step gate dielectric structure 224.

FIGS. 4-5, 6a and 7a are cross sections taken along a line A-A' of FIG. 1, showing cross sections of one embodiment of a method for forming a semiconductor device 500 of the invention. FIGS. 6b and 7b are cross sections taken along a line B-B' of FIG. 1, showing cross sections of one embodiment of a method for forming a semiconductor device 500 of the invention. Please refer to FIGS. 1 and 4, first, a substrate 200 is provided. In one embodiment, the substrate 200 may comprise a silicon substrate. In alternative embodiments, SiGe, bulk semiconductor, strained semiconductor, compound semiconductor, silicon on insulator (SOI), and other commonly used semiconductor substrates can be used for the semiconductor substrate 200. The semiconductor substrate 200 may have a desired conductive type by implanting P-type or N-type dopants. In one embodiment, a conductive type of the substrate 200 is P-type.

Figure 4:
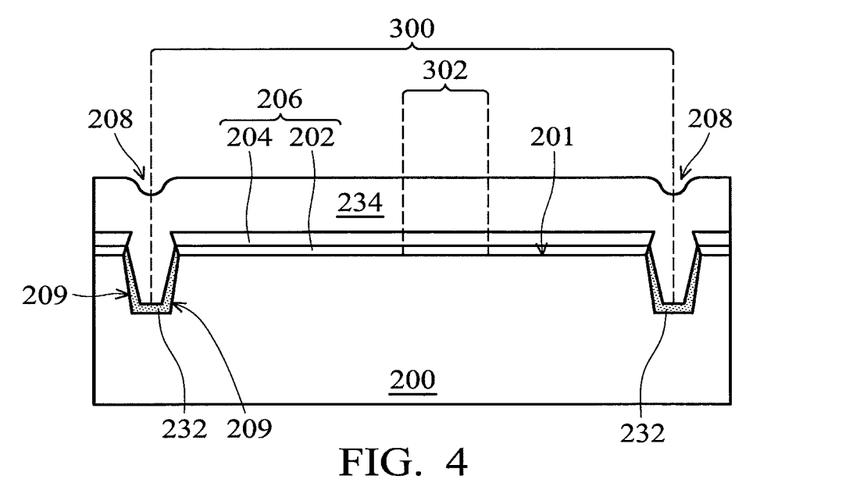
FIGS. 4-5, 6a and 7a are cross sections taken along a line A-A' of FIG. 1, showing cross sections of one embodiment of a method for forming a semiconductor device of the invention.

Next, please refer to FIGS. 1 and 4, a first layer of a first dielectric material 202 and a second dielectric material layer 204 may be formed on the surface 200 in sequence by a deposition process. In one embodiment, the first layer of the first dielectric material 202 may comprise a pad oxide layer, and the second dielectric material layer 204 may comprise a nitride layer. The first layer of the first dielectric material 202 and the second dielectric material layer 204 may collectively serve as a hard mask layer 206 for formation of subsequently formed isolation structures 210.

Next, please refer to FIGS. 1 and 4, the hard mask layer 206 is patterned to define formation positions of the subsequently formed isolation structures 210?, and a portion of a surface 201 of the substrate 200 is exposed from the patterned hard mask layer 206. Next, an etching process is performed to etch the exposed substrate 200 using the hard mask layer 206 as a hard mask to form at least one isolation trench 208 in the substrate 200. Next, a liner layer 232 is formed on a sidewall 209 of the isolation trench 208. Next, a high density plasma chemical vapor deposition (HDPCVD) process is performed to form a dielectric material 234, for example, a high density plasma (HDP) oxide, on the hard mask layer 206, filling the isolation trench 208.

Figure 5:
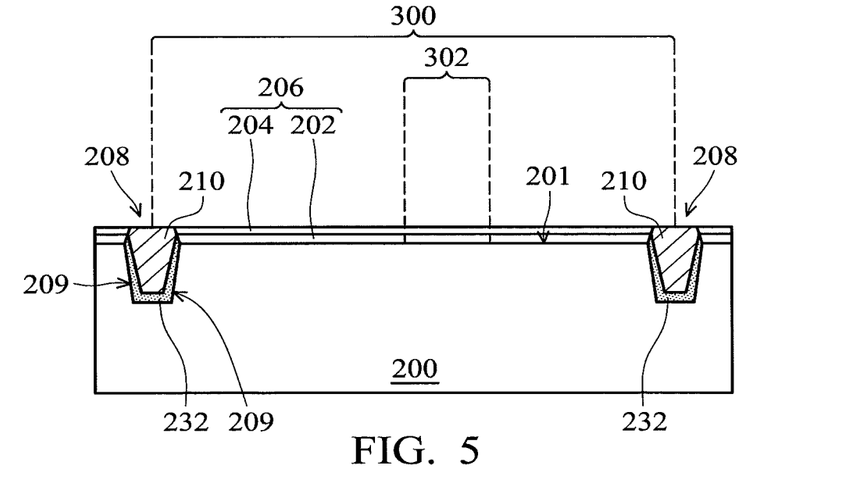

Next, please refer to FIGS. 1 and 5, a chemical mechanical polishing (CMP) process is performed to remove the unnecessary dielectric material 234 over the patterned second dielectric material layer 204 of the hard mask 206 to planarize surfaces of the dielectric material 234 and the second dielectric material layer 204 to form an isolation structure 210, for example, shallow trench isolations (STIs), in the isolation trench 208. The isolation structure 210 is formed from the surface 201 of the substrate 200 and extends into the substrate 200. Also, a top surface of the isolation structure 210 is aligned to a top surface of the second dielectric material layer 204. In this embodiment, the isolation structure 210 is used to define a position of an active region 300 of the substrate 200.

Figure 6A:
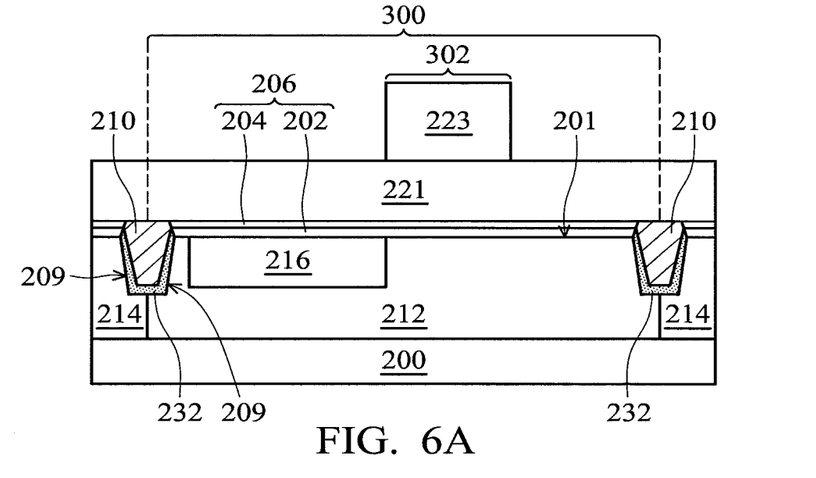
Figure 6B:
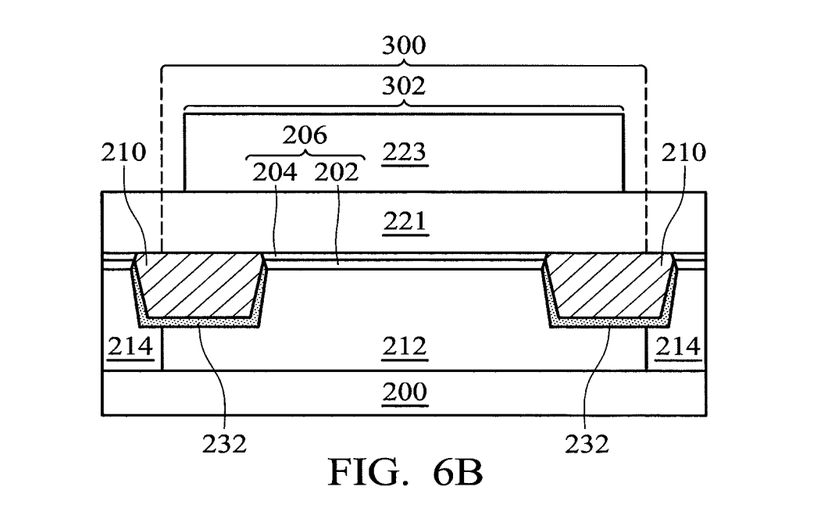
FIGS. 6b and 7b are cross sections taken along a line B-B' of FIG. 1, showing cross sections of one embodiment of a method for forming a semiconductor device of the invention.

Next, please refer to FIGS. 1, 6a and 6b, a doped region 212 may be formed in the substrate 200 in the active region 300 by an implantation process. A conductive type of the doped region 212 is different from that of the substrate 200 in the active region 300. Also, a dopant concentration of the doped region 212 may be larger than that of the substrate 200. In this embodiment, the doped region 212 may serve as an N-type drift doped region 212, used as a channel region and a source region of a resulting semiconductor device.

Next, please refer to FIGS. 1, 6a and 6b again, a doped region 214 may be formed in the substrate 200 on the outside of the active region 300 by another implantation process. The doped region 214 surrounds side boundaries of the isolation structure 210 and the doped region 212. But a bottom boundary of the doped region 212 is not surrounded by the doped region 214. In this embodiment, a conductive type of the doped region 214 may be the same as that of the substrate 200. In this embodiment, a dopant concentration of the doped region 214 may be larger than that of the substrate 200. In this embodiment, the doped region 214 may serve as a P-type well (PW) doped region 214. In one embodiment, a process sequence of the doped regions 212 and 214 is not limited, and the process sequence of the doped regions 212 and 214 can be exchanged.

Next, please refer to FIGS. 1, 6a and 6b again, a doped region 216 may be formed in the substrate 200 in the active region 300 by yet another implantation process. The doped region 216 may be formed in the active region 300 between the isolation structure 210 and a subsequently formed field plate region 302. In this embodiment, a boundary of the doped region 216 may be surrounded by the doped region 212. Also, a conductive type of the doped region 216 is different from that of the substrate 200 (i.e. a conductive type of the doped region 216 is different from that of the doped region 214). In this embodiment, the doped region 216 may serve as a P-type drift doped region 216, used as a drain region of a resulting semiconductor device. In one embodiment, an annealing process may be performed after forming the doped region 216 to laterally diffuse a dopant of the doped region 216 with a graded concentration distribution.

Next, please refer to FIGS. 1, 6a and 6b again, a second layer of the first dielectric material 221 is entirely formed by a chemical vapor deposition (CVD) or atomic layer CVD (ALD) process on the hard mask 206 and the isolation structure 210. In this embodiment, the second layer of the first dielectric material 221 may comprise a high temperature oxide (HTO). In one embodiment, a thickness of the second layer of the first dielectric material 221, formed by the CVD or ALD process, may be well controlled according to design requirements. In one embodiment, a thickness of the second layer of the first dielectric material 221 may be much larger than a total thickness of the hard mask layer 206. Also, a thickness of the first layer of a first dielectric material 202 may be less than that of the second layer of the first dielectric material 221. In this embodiment, the first layer of a first dielectric material 202 and the second layer of the first dielectric material 221 may be formed by materials which are the same as each other, and the second layer of the first dielectric material 221 and the second dielectric material layer 204 may be designed to be formed by materials which are different from each other.

Next, please refer to FIGS. 1, 6a and 6b again, a photolithography process is performed to form a mask pattern 223 on the second layer of the first dielectric material 221 in the active region 300. The mask pattern 223 is used to define a formation position of a field plate region 302 in the active region 300.

Figure 7A:
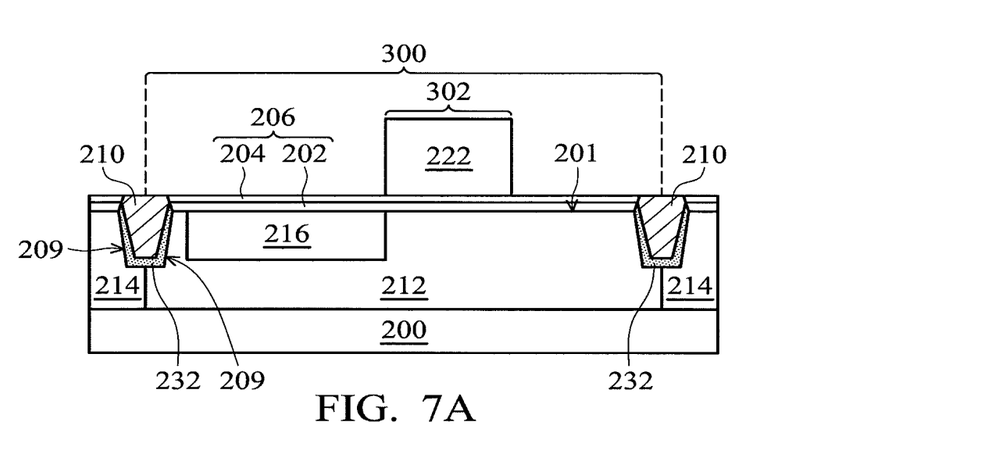
Figure 7B:
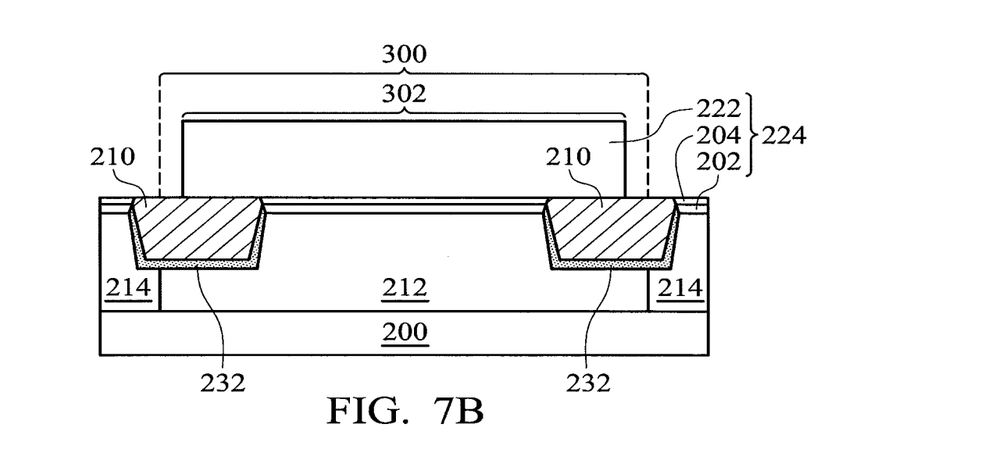

Next, please refer to FIGS. 1, 7a and 7b, an etching process, for example, an anisotropic etching process, is performed using the mask pattern 223 as an etching mask to remove the second layer of the first dielectric material 221 which is not covered by the mask pattern (as shown in FIGS. 6a and 6b). In one embodiment, because the second layer of the first dielectric material 221 and the second dielectric material layer 204 are formed by materials different from each other, an etch rate of the second layer of the first dielectric material 221 to an etchant for the etching process is different from that of the second dielectric material layer 204 to the etchant for the etching process. Therefore, the etching process is performed until a surface of the second dielectric material layer 204 is exposed. After performing the etching process, a second layer pattern of the first dielectric material 222 is formed, wherein the patterned second dielectric material layer 222 may serve as an etching stop layer for the etching process Next, please refer to FIGS. 1, 2 and 3, another etching process, for example, a wet etching process, is performed to remove the patterned first layer of the first dielectric material 202 and the patterned second dielectric material layer 204 (i.e. the hard mask 206) which is not covered by the second layer pattern of the first dielectric material 222 to the surface 201 of the substrate 200 is exposed, thereby forming a step gate dielectric structure 224 on the substrate 200 in the field plate region 300. In one embodiment, the step gate dielectric structure 224 may comprise the patterned first layer of the first dielectric material 202 and the patterned second dielectric material layer 204 (i.e. the patterned hard mask 206) and the second layer pattern of the first dielectric material 222 on the patterned second dielectric material layer 204. In this embodiment, the step gate dielectric structure 222 may be an oxide-nitride-oxide (ONO) composite structure, in which the patterned first layer of the first dielectric material 202 is a pad oxide layer, the patterned second layer of the first dielectric material 222 is a high temperature oxide layer, and the patterned second dielectric material layer 204 is a nitride layer.

Next, please refer to FIGS. 1, 2 and 3 again to describe formations of a gate structure 230, a first pick-up doped region 218 and a second pick-up doped region 220. A gate dielectric layer 226 is formed on the substrate 200 in the active region 300 by a thermal oxidation, chemical vapor deposition (CVD) or atomic layer CVD (ALD) process. The gate dielectric layer 226 may comprise commonly used dielectric materials such as oxide nitride oxynitride, oxycarbide or combinations thereof. Also, the gate dielectric layer 226 may comprise high dielectric constant (k) dielectric materials (k>8) of aluminum oxide ($Al_2O_3$), hafnium oxide, ($HfO_2$), hafnium oxynitride (HfON), hafnium silicate (Hf-$SiO_4$), zirconium oxide ($ZrO_2$), zirconium oxynitride lanthalum oxide, ($La_2O_3$), cerium oxide, ($CeO_2$), titanium oxide ($TiO_2$), tantalum oxide ($Ta_2O_5$). Next, a gate layer 228 may be formed on the gate dielectric layer 226 by a film deposition process such as a CVD process. The gate layer 228 may comprise silicon or polysilicon. The gate layer 228 may be doped by a dopant to reduce sheet resistance thereof. Alternatively, the gate layer 228 may comprise amorphous silicon.

Next, please refer to FIGS. 1, 2 and 3 again, a pattern photoresist (not shown) is formed covering the gate layer 228 to define a formation position of a gate structure 230. A portion of the gate dielectric 226 and a portion of the gate layer 228 to from a gate structure 230 on the substrate 200 in the active region 300 by an anisotropic etching process. Next, the patterned photoresist is removed. As shown in FIGS. 1, 2 and 3, in one embodiment, the gate structure 230 is extended to cover the doped region 216 to the step gate dielectric structure 224. In this embodiment, the gate structure 230 covers a portion of the doped region 216 and a portion of the step gate dielectric structure 224. Also, a portion of the doped region 216 and a portion of the step gate dielectric structure 224 are exposed.

Next, please refer to FIGS. 1, 2 and 3 again, an implantation process is performed to form a first pick-up doped region 218 in a portion of the doped region 212. Also, another implantation process is performed to form a second pick-up doped region 220 in a portion of doped region 216. In one embodiment, a conductive type of the first pick-up doped region 218 is the same as that of the doped region 212, and a conductive type of the second pick-up doped region 220 is the same as that of the doped region 216. In this embodiment, the first pick-up doped region 218 may serve as a pick-up doped region of an N-type drift doped region of the semiconductor device, and a conductive type of the first pick-up doped region 218 is, for example, N-type. Additionally, the second pick-up doped region 220 may serve as a pick-up doped region of a P-type drift doped region of the semiconductor device, and a conductive type of the second pick-up doped region 220 is, for example, P-type. After performing the aforementioned processes, one embodiment of a semiconductor device 500 is formed completely.

As shown in FIGS. 1, 2 and 3, the semiconductor device 500 uses a step gate dielectric structure 224 formed on the substrate 200 in the field plate region 302 to replace the local oxidation of silicon (LOCOS) structures or shallow trench isolation (STI) structures, which serve as a field plate structure of the conventional high voltage device. In one embodiment, the step gate dielectric structure may be an oxide-nitride-oxide (ONO) composite structure, in which an oxide at a lower layered-level (the first layer of the first dielectric material 202) and a nitride at a middle layered-level (the second dielectric material layer 204) of the ONO composite structure are collectively a hard mask layer for the formation isolation structures (such as STI structures). Also, the nitride at the middle layered-level of the ONO composite structure may serve as an etching stop layer for the etching process for the formation of the resulting step gate dielectric structure. Therefore, the gate structure 230 of the semiconductor device 500 may be extended to cover the step gate dielectric structure 224 on the substrate 200 to improve a reduced surface field (RESURF) of the semiconductor device 500. The semiconductor device 500 may maintain high drain-source breakdown voltage (Bvdss). In this embodiment, a thickness T2 of the step gate dielectric structure 224 may be designed (through the forming process) to not equal to a thickness T1 of the isolation structure 210. In this embodiment, a width W2 of the step gate dielectric structure 224 may be designed to be less than that or equal to a width W1 of the isolation structure 210. Further, the step gate dielectric structure 224 is formed over the substrate 200 without extending into the substrate 200. Therefore, compared with the conventional high voltage device, one embodiment of a step gate dielectric structure used in a high voltage device may have a reduced current path from a source region to a drain region of the high voltage device with maintaining a high drain-source breakdown voltage (Bvdss) of the semiconductor device 500. So that the on-resistance (RDSon) can be reduced while maintaining high drain-source breakdown voltage (Bvdss) of the semiconductor device. Further, a power consumption of a LDMOS transistor device can be reduced. Moreover, the semiconductor device 500 having the reduced on-resistance (RDSon) while maintaining high drain-source breakdown voltage (Bvdss) may effectively decrease the on resistance to drain-source breakdown voltage ratio (Bvdss) (Ron/BVdss ratio), so that the semiconductor device 500 may withstand a higher operation voltage. Also, the semiconductor device 500 may have reduced pitch sizes and reduced cell sizes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate;
   a first layer of a first dielectric material and a second dielectric material layer are formed on a surface of the substrate in sequence;
   patterning the first layer of the first dielectric material and the second dielectric material layer;
   removing a portion of the substrate using the patterned first layer of the first dielectric material and the patterned second dielectric material layer as a hard mask to form an isolation trench;
   forming an isolation structure in the isolation trench to define an active region of the substrate;
   entirely forming a second layer of the first dielectric material on the hard mask and the isolation structure;
   forming a mask pattern on the second layer of the first dielectric material in the active region to define a field plate region in the active region;
   performing an etching process to remove the second layer of the first dielectric material not covered by the mask pattern to form a second layer pattern of the first dielectric material, wherein the patterned second dielectric material layer serves as an etching stop layer for the etching process; and
   removing the patterned first layer of the first dielectric material and the patterned second dielectric material layer not covered by the second layer pattern of the first dielectric material to form a step gate dielectric structure on the substrate in the field plate region.

2. The method for forming a semiconductor device as claimed in claim 1, further comprising:
   forming a first doped region in the active region between the isolation structure and the field plate region before forming the second layer of the first dielectric material, wherein a conductive type of the first doped region is different from that of the substrate in the active region.

3. The method for forming a semiconductor device as claimed in claim 1, further comprising:
   forming a gate structure on the substrate in the active region after forming the step gate dielectric structure, wherein the gate structure extended to cover the first doped region to the step gate dielectric structure.

4. The method for forming a semiconductor device as claimed in claim 1, wherein for an isolation structure comprises:
   forming a liner layer on a sidewall of the isolation trench;
   performing a high density plasma chemical vapor deposition process to form a dielectric material on the hard mask layer, filling the isolation trench; and
   performing a chemical mechanical polishing process to remove the unnecessary dielectric material over the patterned second dielectric material layer of the hard mask to form the isolation structure in the isolation trench, wherein a top surface of the isolation structure is aligned to a top surface of the second dielectric material layer.

5. The method for forming a semiconductor device as claimed in claim 1, wherein the step gate dielectric structure is an oxide-nitride-oxide composite structure.

6. The method for forming a semiconductor device as claimed in claim 5, wherein the first layer of the first dielectric material is a pad oxide layer, the second layer of the first dielectric material is a high temperature oxide layer, and the second dielectric material layer is a nitride layer.

7. The method for forming a semiconductor device as claimed in claim 1, wherein a thickness of the step gate dielectric structure is different from that of the isolation structure.

8. The method for forming a semiconductor device as claimed in claim 1, wherein a width of the step gate dielectric structure is less than or equal to that of the isolation structure.

9. The method for forming a semiconductor device as claimed in claim 1, wherein a thickness of the first layer of the first dielectric material is less than that of the second layer of the first dielectric material.

10. The method for forming a semiconductor device as claimed in claim 2, further comprising:
- forming a second doped region in the substrate in the active region, wherein the second doped region surrounds the first doped region, and a conductive type of the first doped region is different from that of the second doped region; and
- forming a third doped region in the substrate outside of the active region, wherein the third doped region surrounds the isolation structure, and the conductive type of the first doped region is the same as that of the third doped region before forming the second layer of the first dielectric material.

* * * * *